United States Patent
Eguchi

(10) Patent No.: US 9,842,984 B2
(45) Date of Patent: Dec. 12, 2017

(54) PIEZOELECTRIC ELEMENT

(71) Applicant: KONICA MINOLTA, INC., Tokyo (JP)

(72) Inventor: Hideyuki Eguchi, Takatsuki (JP)

(73) Assignee: KONICA MINOLTA, INC., Tokyo (JP)

( * ) Notice: Subject to any disclaimer, the term of this patent is extended or adjusted under 35 U.S.C. 154(b) by 511 days.

(21) Appl. No.: 14/397,770

(22) PCT Filed: Apr. 19, 2013

(86) PCT No.: PCT/JP2013/061568
§ 371 (c)(1),
(2) Date: Oct. 29, 2014

(87) PCT Pub. No.: WO2013/164955
PCT Pub. Date: Nov. 7, 2013

(65) Prior Publication Data
US 2015/0084486 A1  Mar. 26, 2015

(30) Foreign Application Priority Data

May 1, 2012 (JP) ................... 2012-104622

(51) Int. Cl.
| | | |
|---|---|---|
| H01L 41/187 | (2006.01) | |
| H01L 41/047 | (2006.01) | |
| H01L 41/09  | (2006.01) | |
| H01L 41/08  | (2006.01) | |

(52) U.S. Cl.
CPC ...... *H01L 41/1875* (2013.01); *H01L 41/0477* (2013.01); *H01L 41/0815* (2013.01); *H01L 41/1876* (2013.01)

(58) Field of Classification Search
CPC ... H01B 3/12; H01L 41/1875; H01L 41/0477; H01L 41/0815; H01L 41/1876
USPC .......... 310/358, 363, 364; 501/134; 252/62.9 PZ, 62.9 R
See application file for complete search history.

(56) References Cited

U.S. PATENT DOCUMENTS 5,935,485 A * 8/1999 Tani ............. H01L 41/187
  252/62.9 PZ
2001/0032992 A1* 10/2001 Wendt ............ H01L 28/60
  257/303

(Continued)

FOREIGN PATENT DOCUMENTS

| JP | 2000-299513 | 10/2000 |
| JP | 2004-047928 | 2/2004 |

(Continued)

OTHER PUBLICATIONS

International Search Report in International Application No. PCT/JP2013/061568, dated May 21, 2013, in English, 2 pages.

(Continued)

*Primary Examiner* — Thomas Dougherty
(74) *Attorney, Agent, or Firm* — Brinks Gilson & Lione

(57) ABSTRACT

Disclosed is a piezoelectric element wherein a lower electrode made of Pt, a buffer layer made of PLT, and a piezoelectric thin film to be a perovskite ferroelectric thin film are formed in this order on a substrate. The average crystal grain size of Pt forming the lower electrode is not smaller than 50 nm and not larger than 150 nm.

13 Claims, 7 Drawing Sheets

(56) References Cited

U.S. PATENT DOCUMENTS

| | | | |
|---|---|---|---|
| 2003/0234835 A1* | 12/2003 | Torii | B41J 2/14233 347/68 |
| 2004/0104981 A1 | 6/2004 | Fujii et al. | |
| 2005/0127795 A1* | 6/2005 | Torii | B41J 2/14233 310/360 |
| 2005/0146772 A1* | 7/2005 | Murata | B41J 2/14233 359/291 |
| 2010/0014143 A1* | 1/2010 | Kanno | B81B 3/004 359/224.1 |
| 2011/0221831 A1* | 9/2011 | Yonemura | B41J 2/055 347/68 |
| 2016/0250855 A1* | 9/2016 | Shibuya | H01L 41/29 347/71 |

FOREIGN PATENT DOCUMENTS

| | | | | |
|---|---|---|---|---|
| JP | 2007-308782 | | 11/2007 | |
| JP | 4058018 | | 3/2008 | |
| JP | 2012-059852 | | 3/2012 | |
| JP | WO-2013/164955 A1 | * | 7/2013 | H01L 41/09 |
| JP | 2014199910 A | * | 11/2013 | H01L 41/047 |
| JP | WO-2015/064341 A1 | * | 7/2015 | H01L 41/047 |
| WO | WO 2012/039266 A1 | | 3/2012 | |

OTHER PUBLICATIONS

Written Opinion of the International Searching Authority in International Application No. PCT/JP2013/061568, dated May 21, 2013, with English translation, 4 pages.

Office Action in Japanese Patent Application No. 2014-513359, dated Apr. 30, 2015, with English translation, 10 pages.

* cited by examiner (001) ORIENTATION (100) ORIENTATION

PIEZOELECTRIC ELEMENT

This application is a National Stage application of International Application No. PCT/JP2013/061568, filed Apr. 19, 2013.

TECHNICAL FIELD

The present invention relates to a piezoelectric element including a lower electrode, a buffer layer, and a ferroelectric thin film formed in this order on a substrate.

BACKGROUND ART

In recent years, lead-based piezoelectric materials such as lead zirconate titanate ($Pb(Zr,Ti)O_3$) and lead-free piezoelectric materials containing no lead are used for mechano-electrical transducers to be applied to drive elements, sensors and the like. Such piezoelectric materials, being formed into thin films on substrates of silicon (Si) or the like, are expected to be applied to MEMS (Micro Electro Mechanical Systems) elements.

In manufacture of MEMS elements, high-precision processing using semiconductor process technologies such as photolithography can be applied, and smaller and higher-density elements can thus be obtained. In particular, fabrication of elements all together at a high density on a Si wafer having a relatively large diameter of 6 or 8 inches can significantly reduce the cost as compared to single-wafer manufacturing in which elements are individually produced.

Furthermore, as a result of reducing the thickness of piezoelectric materials and making devices in the form of MEMS devices, the efficiency of mechano-electrical transduction is improved, which also produces a new added value such as improvement in device sensitivity and characteristics. For example, heat sensors are reduced in thermal conductance as a result of being made in the form of MEMS devices and can thus be improved in measurement sensitivity, and inkjet heads for printers can achieve high-resolution patterning as a result of increased density of nozzles. In addition, a high piezoelectric constant d31 is required for a piezoelectric thin film necessary for such devices.

When a piezoelectric thin film is used as a MEMS drive element, the piezoelectric thin film needs to be formed to have a thickness of 3 to 5 μm, for example, which may depend on the device to be designed, so as to satisfy a required displacement generating force. For forming a piezoelectric thin film on a substrate made of Si or the like, chemical film forming methods such as CVD (Chemical Vapor Deposition), physical methods such as sputtering and ion plating, and liquid phase growth method such as the sol-gel method are known, and it is important to find conditions for film formation to obtain films having required properties depending on these film forming methods.

The material used for a piezoelectric thin film is often crystals of PZT, that is, lead (Pb), zirconium (Zr), titanium (Ti), and oxygen (O). PZT exhibits a good piezoelectric effect with an $ABO_3$ perovskite structure as illustrated in FIG. 8, and thus needs to be a single-phase perovskite. Conversely, a piezoelectric thin film having a low crystallinity and being increased in crystals with a pyrochlore structure and in amorphous regions has low piezoelectric properties. Since Pb easily evaporates in PZT film formation, conditions for film formation need to be set carefully to obtain perovskite crystals.

The shape of unit cells of PZT crystals having the $ABO_3$ perovskite structure varies depending on the ratio of Ti and Zr that are atoms in a B site. Specifically, the PZT crystal lattice is tetragonal when the amount of Ti is large, and the PZT crystal lattice is rhombohedral when the amount of Zr is large. When the molar ratio of Zr to Ti is approximately 52:48, both of these crystal structures are present, and a phase boundary having such a composition ratio is referred to as a MPB (Morphotropic Phase Boundary). Since maximums of piezoelectric properties such as the piezoelectric constant, the polarization value, and the dielectric constant are obtained with this MPB composition, piezoelectric thin films having the MPB composition are actively used.

Furthermore, in addition to using the perovskite crystallinity and the MPB composition, proper control of the crystal orientation of piezoelectric thin films is also important for increasing the piezoelectric constant. For example, orientations of Pb-based perovskite crystals are (100), (110), (111), etc., among which the (001) orientation using polarization aligned in the direction of electric field application and the (100) orientation using effects of domain rotation are effective in increasing the piezoelectric constant d31 as illustrated in FIG. 9. In FIG. 9, thick black arrows indicate the direction of polarization. In this case, if a normal piezoelectric strain ΔX1 when an electric field is applied in the (001) direction to a domain having tetragonal polarization in the (001) direction and a piezoelectric strain ΔX2 when the same electric field is applied in the direction of (001) to a domain having tetragonal polarization in the (100) direction are compared, the piezoelectric strain ΔX2 resulting from rotation of the domain 90° from the (100) direction to the (001) direction is larger than the normal piezoelectric strain ΔX1.

Since the crystal orientation of a piezoelectric thin film is strongly influenced by an underlying layer, control of the crystal orientation of the underlying layer is very important in addition to conditions for forming the piezoelectric thin film. Thus, a method of performing high-temperature Pt film formation under an oxygen atmosphere to form a Pt lower electrode in the (100) orientation and forming a Pb-based perovskite piezoelectric thin film thereon in the (100) orientation, and a method of forming a film of a Pt lower electrode in the (001) orientation on a single crystal substrate of (001) MgO or the like and forming a Pb-based perovskite piezoelectric thin film thereon in the (001) orientation are proposed. It is difficult, however, to put these methods to practical use in terms of reliability and productivity.

Thus, in Patent Literature 1, for example, a buffer layer for controlling the crystal orientation of PZT is formed between an electrode made of a set of columnar grains made of Pt and having a cross-sectional diameter of not smaller than 20 nm and not larger than 30 nm and PZT in the form of a Pb-based perovskite ferroelectric thin film. The buffer layer is made of perovskite lead lanthanum titanate (PLT) having a (001) crystal orientation ratio of 50%. In this manner, a perovskite PLT film in the (001) orientation is formed on an electrode to form PZT in the (001) orientation on the PLT.

CITATION LIST

Patent Literature

Patent Literature 1: JP 4058018 B

SUMMARY OF INVENTION

Technical Problem

With the structure of Patent Literature 1, however, the grain size of Pt forming the lower electrode is not smaller than 20 nm and not larger than 30 nm as described above. Since the crystallinity of Pt is not high with such a grain size, a PLT film having a high perovskite crystallinity cannot be formed stably on Pt. As a result, a perovskite ferroelectric thin film cannot be formed stably on PLT.

Furthermore, Pt has a high self-orientation and is easily formed in the (111) orientation; however, if the grain size is too large, the crystallinity of Pt is too high and it is difficult to form PLT in an orientation (the (100) orientation, for example) different from that of Pt. As a result, it is difficult to form a ferroelectric thin film in a desired orientation (the (100) orientation, for example) on PLT to improve the piezoelectric properties.

The present invention has been made to solve the aforementioned problems and an object thereof is to provide a piezoelectric element in which the grain size of Pt forming a lower electrode is properly determined to stably form a perovskite ferroelectric thin film of PLT having a high perovskite crystallinity in a desired orientation with a buffer layer therebetween, which can realize high piezoelectric properties.

Solution to Problem

An aspect of the present invention is a piezoelectric element including a lower electrode made of platinum, a buffer layer made of lead lanthanum titanate, and a perovskite ferroelectric thin film formed in this order on a substrate, wherein platinum forming the lower electrode has an average grain size of not smaller than 50 nm and not larger than 150 nm.

DESCRIPTION OF EMBODIMENTS

An embodiment of the present invention is described as follows with reference to the drawings.

[1. Structure of Piezoelectric Element]

Figure 1:
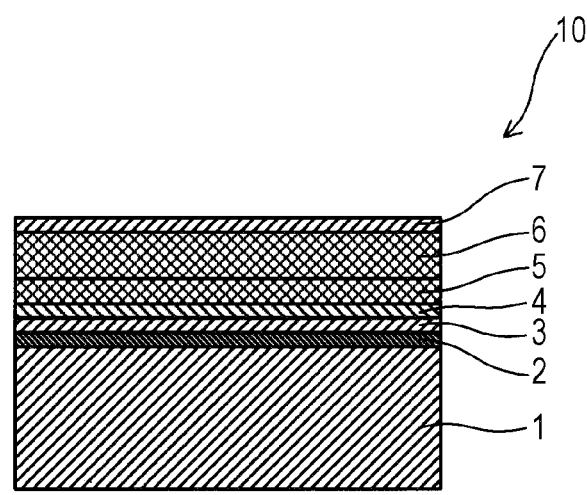
FIG. 1 is a sectional view illustrating a schematic structure a piezoelectric element according to an embodiment of the present invention.

FIG. 1 is a sectional view illustrating a schematic structure of a piezoelectric element 10 according to the present embodiment. The piezoelectric element 10 according to the present embodiment includes a thermal oxide film 2, an adhesion layer 3, a lower electrode 4, a buffer layer 5, a piezoelectric thin film 6, and an upper electrode 7 laminated in this order on a substrate 1.

The substrate 1 is a semiconductor substrate made of single-crystal Si (silicon) alone or a SOI (Silicon on Insulator) substrate having a thickness of about 300 to 500 µm, for example. The substrate 1 may be made of other materials, but is preferably a Si substrate or a SOI substrate in terms of affinity with MEMS processes.

The thermal oxide film 2 is an insulating film made of $SiO_2$ (silicon oxide) and having a thickness of about 0.1 µm, for example. The piezoelectric element 10 can be formed without the thermal oxide film 2, but if the thermal oxide film 2 is provided, current leakage from the lower electrode 4 to the substrate 1 can be prevented by the thermal oxide film 2 and a reliable device can be realized when the piezoelectric element 10 is applied to a device such as an inkjet head. When the substrate 1 is a Si substrate or an SOI substrate, a high-quality thermal oxide film 2 made of $SiO_2$ can be easily obtained by thermal oxidization of the substrate 1; however, the thermal oxide film 2 may be another insulating film such as a silicon nitride film.

The adhesion layer 3 is provided to improve adhesion between the underlying layer (the thermal oxide film 2 or the substrate 1) and the lower electrode 4, and made of titanium (Ti) having a thickness of about 10 nm, for example. Alternatively, the adhesion layer 3 may be made of titanium oxide (TiOx).

The lower electrode 4 is made of platinum (Pt) having a thickness of about 0.1 µm, for example. Pt has self-orientation, and is oriented in the (111) direction with respect to the substrate 1. The lower electrode 4 is formed to have an average crystal grain size (average grain size) of Pt within a desired range, which will be described later.

The buffer layer 5 is a layer for controlling crystal orientation of the piezoelectric thin film 6, and is made of perovskite lead lanthanum titanate (PLT) in the present embodiment. PLT is oriented in the (100) direction parallel to the plane of the substrate 1 (lamination plane).

The piezoelectric thin film 6 is a perovskite ferroelectric thin film. In the present embodiment, the ferroelectric thin film is made of lead zirconate titanate (PZT) expressed by $Pb(Zr_xTi_{1-x})O_3$. The thickness of the piezoelectric thin film 6 varies depending on the application, and is not larger than 1 µm, for example, for application of a memory or a sensor and in a range of 3 to 5 µm, for example, for an actuator.

The upper electrode 7 is a laminate of a Ti layer and a Pt layer. The Ti layer is formed to improve adhesion between the piezoelectric thin film 6 and the Pt layer. The Ti layer has a thickness of about 0.02 µm, for example, and the Pt layer has a thickness of about 0.2 µm, for example.

[2. Regarding Grain Size of Lower Electrode]

Figure 2:
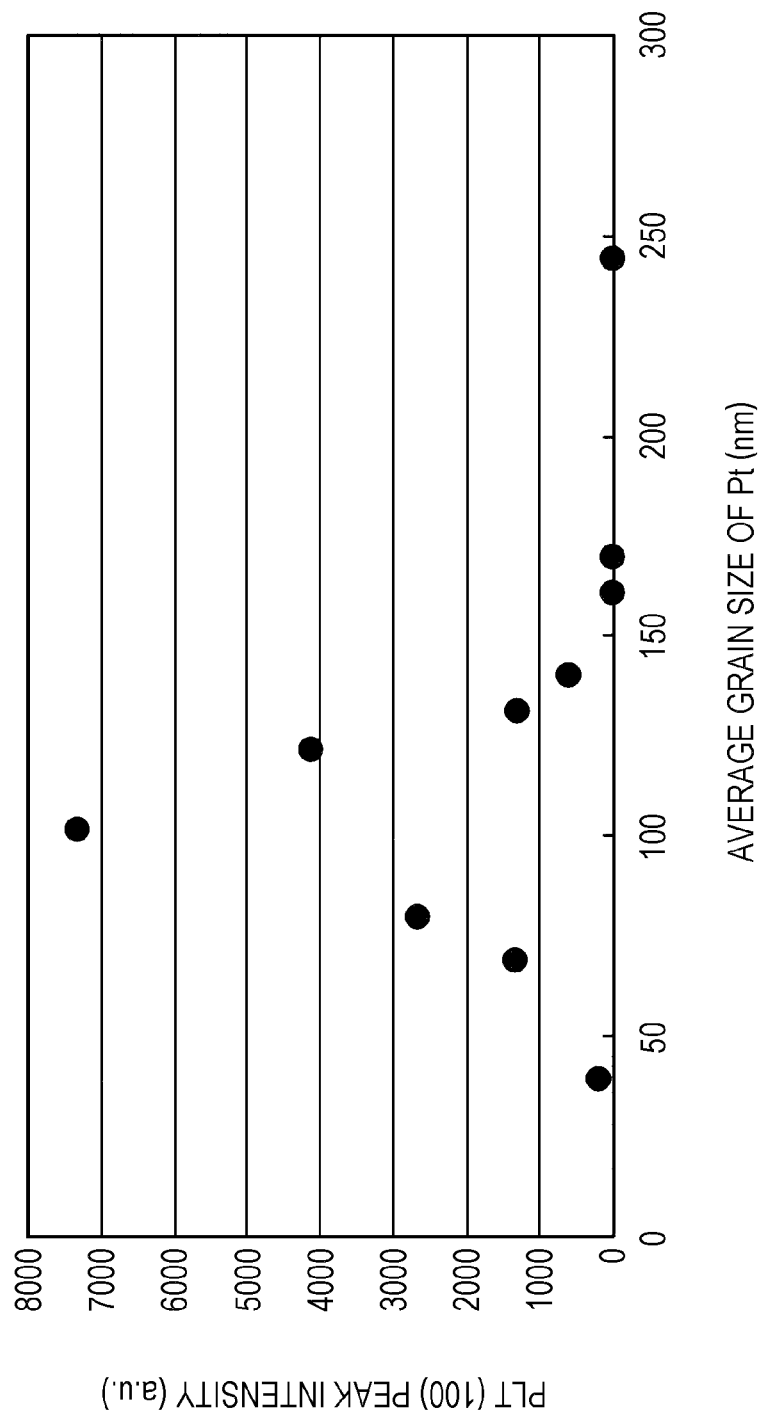
FIG. 2 is a graph illustrating the relation between an average grain size of Pt forming a lower electrode of the piezoelectric element and the (100) orientation of PLT forming a buffer layer formed on the lower electrode.

Next, the grain size of Pt forming the lower electrode 4 will be described. FIG. 2 is a graph illustrating the relation between the average grain size of Pt and the (100) orientation of PLT. As illustrated in FIG. 2, the (100) orientation of PLT of the buffer layer 5 formed on Pt was examined while changing the grain size of Pt by changing film forming conditions for Pt.

The average grain size of Pt is obtained by obtaining the square root $\sqrt{A}$ of the area A of each crystal calculated from the grain boundary of Pt on a plane parallel to the lamination plane (a plane parallel to the plane of the substrate 1) as a grain size d (nm), and averaging the obtained grain sizes. The grain boundary can be recognized by observation under a SEM (Scanning Electron Microscope), for example.

The (100) orientation of PLT is determined on the basis of a peak intensity representing the perovskite (100) orientation of PLT obtained by carrying out 2θ/θ measurement of X-ray diffraction (XRD) on PLT, and is higher as the peak intensity is higher.

Note that the 2θ/θ measurement of the x-ray diffraction is a method of making x rays incident on a sample at an angle θ from the horizontal direction (at an angle θ from the crystal plane) and detecting x rays at an angle of 2θ with respect to the incident x rays among x rays reflected by and exiting the sample to examine an intensity change with respect to θ. In diffraction of x rays, the diffraction intensity is high when the Bragg condition (2d sin θ=nλ(λ: wavelength of x rays, d: crystal atom spacing, n: integer)) is satisfied, where the crystal spacing (lattice constant) and 2θ are correlated. Thus, the crystal structure and the orientation of the sample on which x rays are incident can be obtained on the basis of a value of 2θ at which the diffraction intensity is high.

The peak intensity obtained by 2θ/θ measurement of x-ray diffraction is a diffraction intensity during x-ray irradiation, and is usually represented by a count per second (cps) of x rays, but is represented by an arbitrary unit (a.u.) instead of an absolute value (count per second) in FIG. 2 for relative comparison of the (100) orientation of PLT per average grain size of Pt.

In FIG. 2, when the average grain size of Pt is over 150 nm, the (100) orientation of PLT is low. This is considered to be because the crystallinity of Pt is so high that PLT undergoes crystal growth following the (111) orientation of Pt, which results in the (111) orientation of PLT instead of the (100) orientation. Furthermore, while PLT has the best (100) orientation at an average grain size of Pt around 100 nm, it is difficult to stably obtain high quality perovskite crystals in PLT formed on Pt because Pt has low crystallinity at an average grain size smaller than 50 nm.

Thus, it can be said that PLT with high perovskite crystallinity can be formed stably in a desired orientation (herein, the (100) orientation) by controlling the grain size of Pt so that the average grain size of Pt is not smaller than 50 nm and not larger than 150 nm even on an amorphous film with no orientation such as the thermal oxide film 2 ($SiO_2$). In particular, the effect can be ensured at an average grain size Pt not smaller than 100 nm and not larger than 150 nm.

Figure 3:
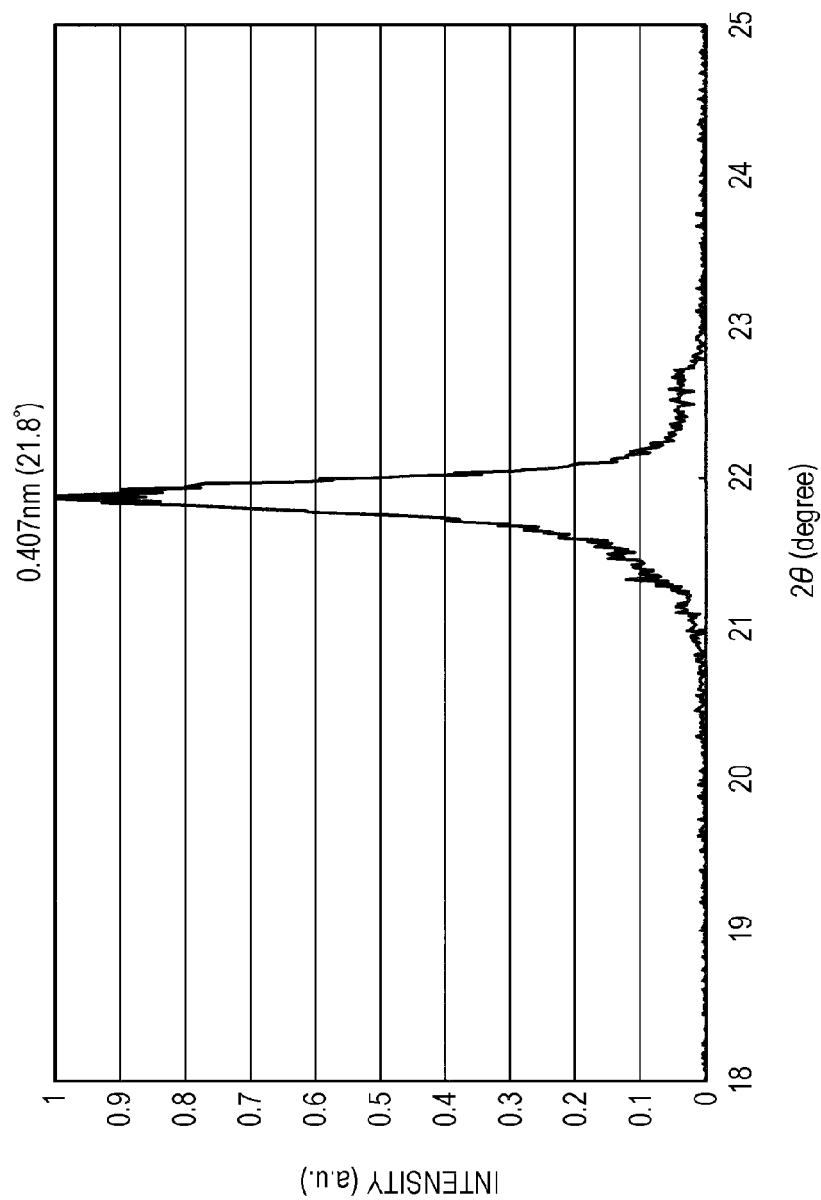
FIG. 3 is a graph illustrating a result of carrying out 2θ/θ measurement of x-ray diffraction on a PZT film to be a piezoelectric thin film formed on the buffer layer.

Next, the crystal orientation of PZT will be described. FIG. 3 is a graph illustrating a result of carrying out 2θ/θ measurement of x-ray diffraction on a PZT film formed to have a thickness of 1 μm by sputtering on PLT in the (100) orientation. A target used for sputtering of PZT has a Zr/Ti ratio of 52/48 in atm % ratio, that is, the MPB composition. This graph shows that PZT is in the form of perovskite crystals mainly oriented in the (100) direction. This is considered to be because, while complex oxide of Zr is less likely to be crystallized and perovskite crystal cannot be easily obtained when a PZT film is formed directly on a noble metal such as Pt, presence of perovskite crystals of PLT allows PZT to grow on the PZT serving as a crystal nucleus and easily form perovskite crystals. Furthermore, since the underlying PLT is in the (100) orientation, the PZT film formed thereon is also considered to easily grow in the (100) orientation.

Figure 4:
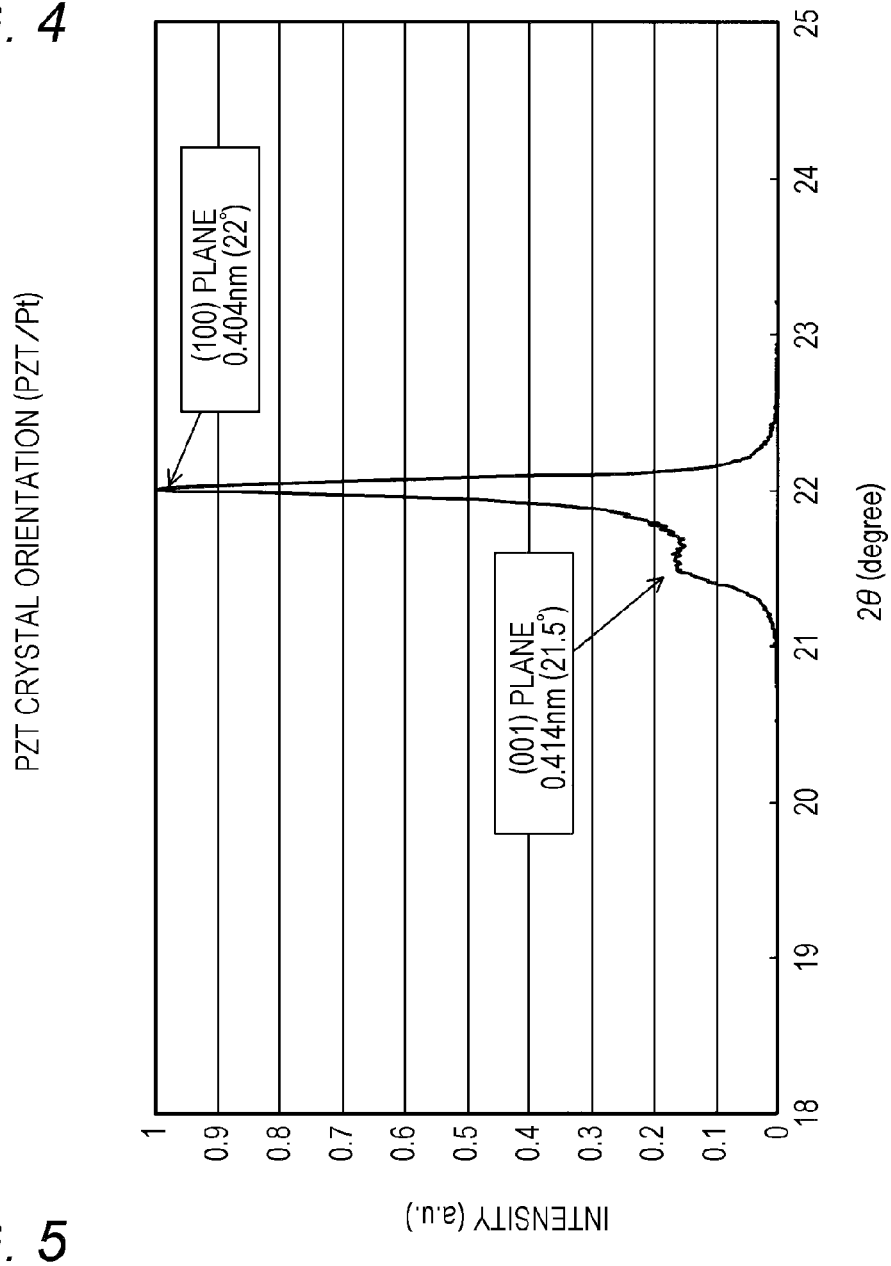
FIG. 4 is a graph illustrating a result of carrying out 2θ/θ measurement of x-ray diffraction on the PZT film formed on the lower electrode without forming the buffer layer.

In addition, FIG. 4 is a graph illustrating a result of carrying out 2θ/θ measurement of x-ray diffraction on the PZT film formed to have a thickness of 1 μm directly on Pt without forming the PLT film. A target used for sputtering of PZT has a Zr/Ti ratio of 52/48 in atm % ratio, that is, the MPB composition. When the PZT film is directly formed on Pt, the intensity peak of PZT is divided into a peak (spacing 0.404 nm, 2θ=22°) indicating the (100) orientation and a peak (spacing 0.414 nm, 2θ=21.5°) indicating the (001) orientation. This is considered to be because a Ti-rich film is formed at an initial stage of film formation while the PZT film grows on Pt and PZT in the tetragonal (100) orientation and PZT in the tetragonal (001) orientation are easily formed.

In contrast, as illustrated in FIG. 3, when a PZT film is formed on PLT in the (100) orientation, the intensity peak of PZT is not divided into two as in FIG. 4 but a peak only appears at a slightly smaller angle than the tetragonal (100) peak in FIG. 4. Specifically, in FIG. 3, the intensity peak of PZT only appears within a range (21.5° to 22°) of 2θ corresponding to a crystal lattice spacing of 0.404 to 0.414 nm. In this case, since the peak is not divided as in FIG. 4, PZT is considered to undergo crystal growth while maintaining the Zr/Ti ratio that is the MPB composition ratio from the initial stage of film formation. Note that the peak appearing at 2θ=22° to 23° is not a peak due to PZT but a peak due to PLT perovskite.

Figure 5:
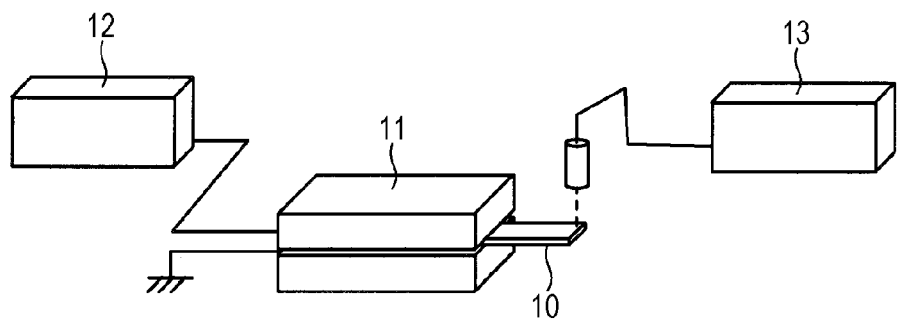
FIG. 5 is a perspective view illustrating a schematic structure of a piezoelectric displacement meter.

Next, using the piezoelectric element 10 obtained by forming a PZT film with a thickness of 4 μm with PLT therebetween and a piezoelectric element obtained by forming PZT with a thickness of 4 μm on Pt, piezoelectric displacements were measured by the cantilever method using a piezoelectric displacement meter illustrated in FIG. 5 to obtain piezoelectric constants d31. As a result, the piezoelectric constant d31 of the piezoelectric element 10 obtained by forming the PZT film on Pt with PLT therebetween was a high value of −180 pm/V, and the piezoelectric constant d31 of the piezoelectric element obtained by forming a PZT film directly on Pt was a low value of about −140 pm/V.

Note that the piezoelectric displacement meter clamps an end of the piezoelectric element 10 by a fixing part 11 so that the length for which a cantilever is movable is 10 mm to form a cantilever structure, applies a maximum voltage of 0 V to the upper electrode 7 and a minimum voltage of −20 V to the lower electrode 4 at a frequency of 500 Hz by a function generator 12, observes a displacement of the end of the piezoelectric element 10 by a laser Doppler vibrometer 13, and obtains the piezoelectric constant d31 from the piezoelectric displacement by a known method.

As described above, with the average grain size Pt forming the lower electrode 4 being not smaller than 50 nm and not larger than 150 nm, the buffer layer 5 (PLT) having a high perovskite crystallinity can be stably formed in a desired orientation (the (100) orientation, for example) on the lower electrode 4. As a result, a perovskite PZT film can be stably formed in a desired orientation (the (100) orientation, for example) as the piezoelectric thin film 6 on the buffer layer 5, achieving high piezoelectric properties. Specifically, the piezoelectric element 10 excellent in stability of formation of a PZT film made of a perovskite single layer and having high piezoelectric properties can be realized. In particular, with the average grain size of Pt being not smaller than 100 nm and not larger than 150 nm, decrease in Pt crystallinity can be reliably avoided, which ensures formation of the buffer layer 5 and the piezoelectric thin film 6 having the perovskite crystal structure and realization of high piezoelectric properties. Furthermore, since a perovskite PZT film can be formed in a desired orientation without using an expensive single-crystal substrate of magnesium oxide (MgO) or the like, the productivity of the piezoelectric element 10 can be improved. In other words, the piezoelectric element 10 can be produced at low cost.

Furthermore, since PLT in the form of the buffer layer 5 is in the (100) orientation, PZT in the form of the piezoelectric thin film 6 can also be easily formed in the (100) orientation. In addition, since PZT is in the (100) orientation, the piezoelectric properties can be improved by using domain rotation PZT. Specifically, when voltage is applied in a direction perpendicular to the substrate 1, the PZT polarization direction can be changed from the direction parallel to the substrate 1 to the direction perpendicular to the substrate 1 to obtain great piezoelectric properties.

Furthermore, as illustrated in FIG. 3, when 2θ/θ measurement of x-ray diffraction is carried out on PZT, the intensity peak of PZT appears without being divided within a range of 2θ corresponding to a crystal lattice spacing of 0.404 to 0.414 nm and PZT can be grown in the MPB composition from the initial stage of film formation, and the piezoelectric properties can thus be further improved by the MPB composition. Such an effect can be produced when Zr/Ti ratio of PZT is a ratio of the MPB composition, that is, when x=0.50 to 0.55 is satisfied in PZT expressed by $Pb(Zr_xTi_{1-x})O_3$.

Although the intensity peak appears at the position of 21.8° shifted leftward on the horizontal axis from the position of 22° that is the value of 2θ corresponding to a crystal lattice spacing of 0.404 nm in the example illustrated in FIG. 3, an intensity peak may appear at the position of 22° that is the value of 2θ corresponding to a crystal lattice spacing of 0.404 nm without being divided depending on conditions for film formation, which is within the scope of the present invention. Alternatively, an intensity peak may appear at the position of 21.5° that is the value of 2θ corresponding to a crystal lattice spacing of 0.414 nm without being divided, which is within the scope of the present invention.

[3. Method for Producing Piezoelectric Element]

Next, examples of a method for producing the piezoelectric element 10 according to the present embodiment will be described. FIGS. 6A to 6D are sectional views illustrating processes of manufacturing the piezoelectric element 10.

Example 1

Figure 6A:
FIG. 6A is a sectional view illustrating a process of manufacturing the piezoelectric element.

First, as illustrated in FIG. 6A, a thermal oxide film 2 made of $SiO_2$ with a thickness of about 100 nm was formed on a substrate 1 made of a single-crystal Si wafer with a thickness of about 400 μm. Note that the substrate 1 may be a standard substrate having a thickness of 300 to 725 μm and a diameter of 3 to 8 inches. The thermal oxide film 2 can be formed by using a heating furnace for wet oxidation and exposing the substrate 1 to a high temperature of about 1000 to 1200° C. in an oxygen atmosphere.

Figure 6B:
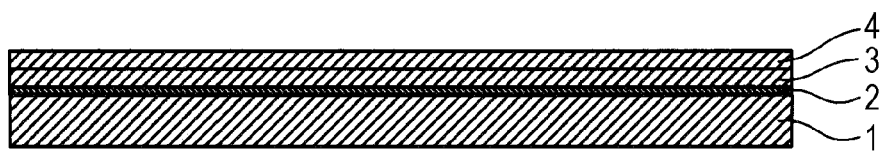
FIG. 6B is a sectional view illustrating a process of manufacturing the piezoelectric element.

Subsequently, as illustrated in FIG. 6B, an adhesion layer 3 made of Ti with a thickness of about 10 nm and a lower electrode 4 made of Pt with a thickness of about 150 nm were formed in this order on the thermal oxide film 2 by sputtering. In this process, the Ti sputtering conditions were Ar flow rate: 20 sccm, pressure: 0.8 Pa, and RF power applied to target: 80 W, and the Pt sputtering conditions were Ar flow rate: 20 sccm, pressure: 0.5 Pa, RF power applied to target: 100 W, and substrate temperature: 500° C. Pt forms a film oriented in the (111) direction because of self-orientation. An average grain size of Pt measured by the SEM was approximately 100 nm.

Note that the adhesion layer 3 is not essential and a PLT film in the (100) orientation can be obtained without Ti, but it is preferable to form the adhesion layer 3 between the lower electrode 4 and the thermal oxide film 2 to ensure adhesion between the lower electrode 4 and the thermal oxide film 2.

Figure 6C:
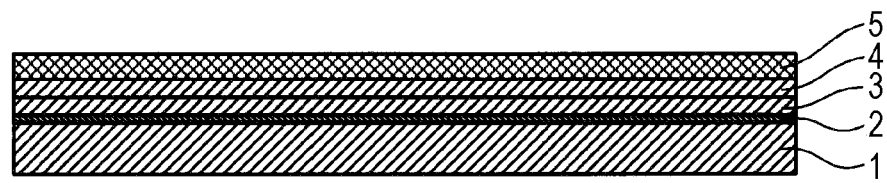
FIG. 6C is a sectional view illustrating a process of manufacturing the piezoelectric element.

Subsequently, as illustrated in FIG. 6C, PLT was formed with a thickness of about 90 nm on the lower electrode 4 by sputtering to form a buffer layer 5. In this process, the PLT sputtering conditions were Ar flow rate: 19 sccm, $O_2$ flow rate: 1 sccm, pressure: 0.5 Pa, RF power applied to target: 145 W, and substrate temperature: 645° C. A resulting PLT film was found to be a film strongly oriented in the (100) direction through XRD measurement. Since a PLT film formed at a high temperature lacks Pb as a result of Pb evaporation, Pb was added to the target in advance in an amount 20 to 40 atm % larger than the amount according to stoichiometry (stoichiometric ratio). The additional amount of Pb may be changed within a range in which a perovskite film can be obtained depending on the relation with film formation temperature and other conditions for film formation.

Figure 6D:
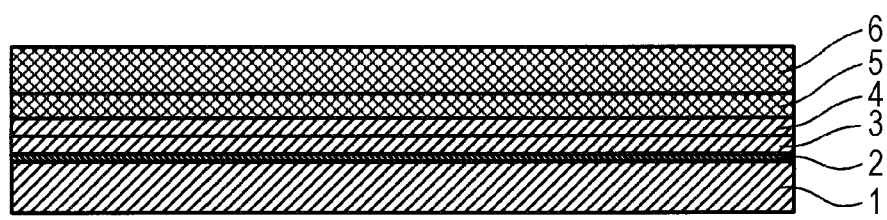
FIG. 6D is a sectional view illustrating a process of manufacturing the piezoelectric element.

Subsequently, as illustrated in FIG. 6D, a PZT film to be a piezoelectric thin film 6 was formed with a thickness of about 4 μm by sputtering on the buffer layer 5, that is, on PLT in the (100) orientation. The PZT sputtering conditions were Ar flow rate: 20 sccm, $O_2$ flow rate: 0.4 sccm, pressure: 0.4 Pa, substrate temperature: 650° C., and RF power applied to target: 450 W. A PZT film formed at a high temperature also lacks Pb as a result of Pb evaporation. To compensate for Pb outgassing, the amount of Pb in excess in the PZT target may be increased, and the Pb amount in the target is at least not smaller than 1.2 mol %, preferably 1.3 to 1.5 mol % when the Pb amount in the stoichiometric composition of PZT is 1.

Finally, Ti and Pt were sputtered in this order on the piezoelectric thin film 6 to form an upper electrode 7, and the piezoelectric element 10 (see FIG. 1) was thus completed. A measured piezoelectric constant d31 of the piezoelectric element 10 was −180 pm/V.

Example 2

In Example 2, lead lanthanum zirconate titanate (PLZT) was used for the piezoelectric thin film 6 instead of PZT. Other processes are the same as those in Example 1. Specifically, PLZT to be the piezoelectric thin film 6 was formed by sputtering on the buffer layer 5 made of PLT. In this process, the PLZT sputtering conditions were Ar flow rate: 25 sccm, $O_2$ flow rate: 0.8 sccm, pressure: 0.4 Pa, substrate temperature: 500° C., and RF power applied to target: 400 W. As a result, a PLZT film of $(Pb_{1-x}La_x)(Zr_yTi_{1-y})_{1-x/4}O_3$ (x=7.5, y=0.6) was formed with a thickness of 4 μm.

Figure 7:
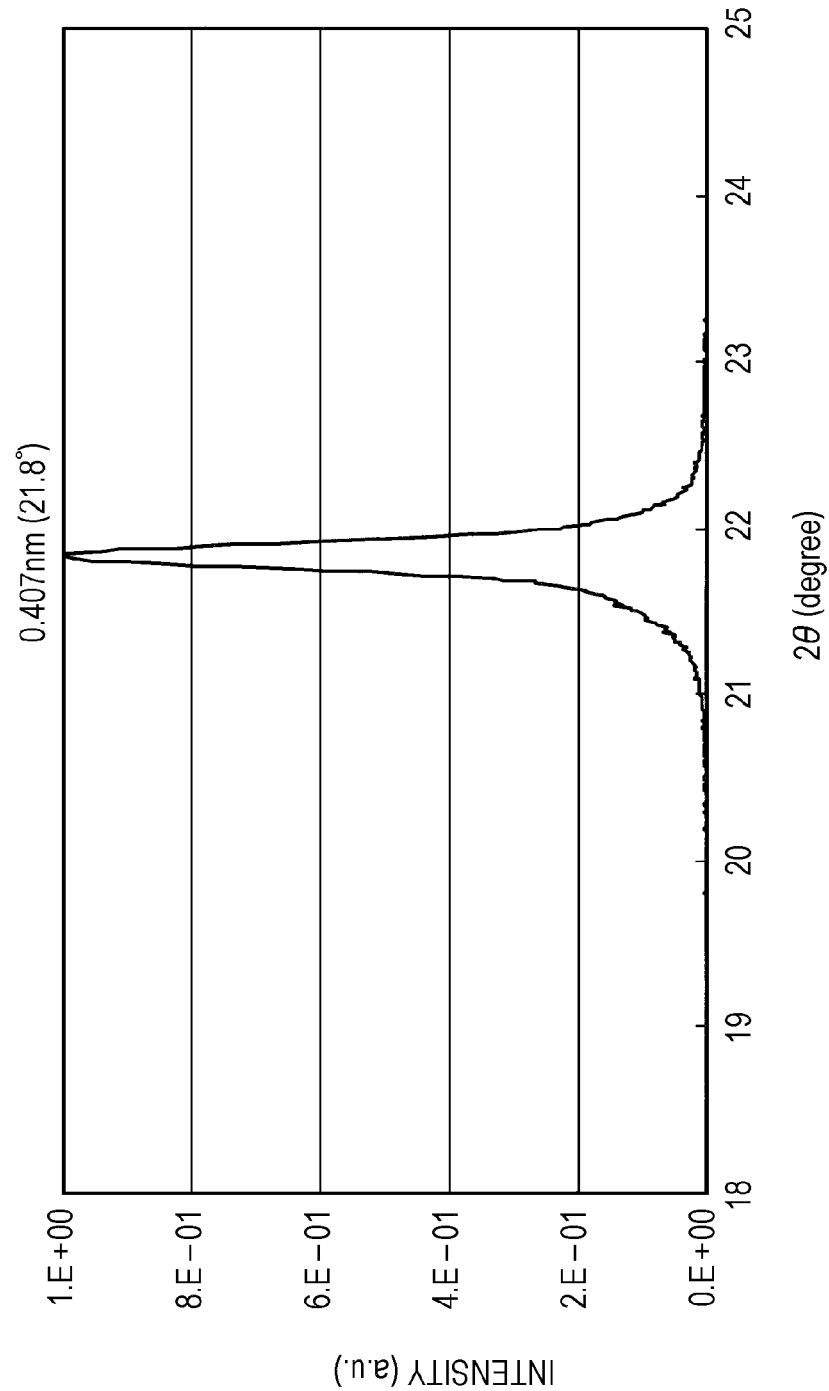
FIG. 7 is a graph illustrating a result of carrying out 2θ/θ measurement of x-ray diffraction on a PLZT film to be a piezoelectric thin film formed on the buffer layer.
Figure 8:
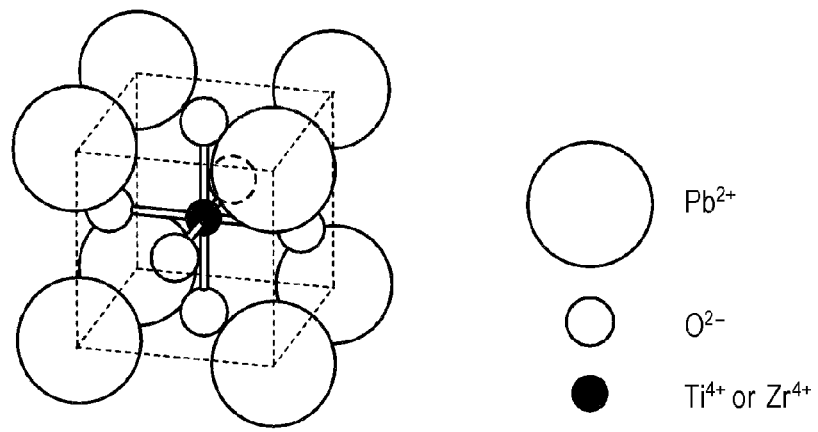
FIG. 8 is an explanatory view schematically illustrating a crystal structure of PZT.
Figure 9:
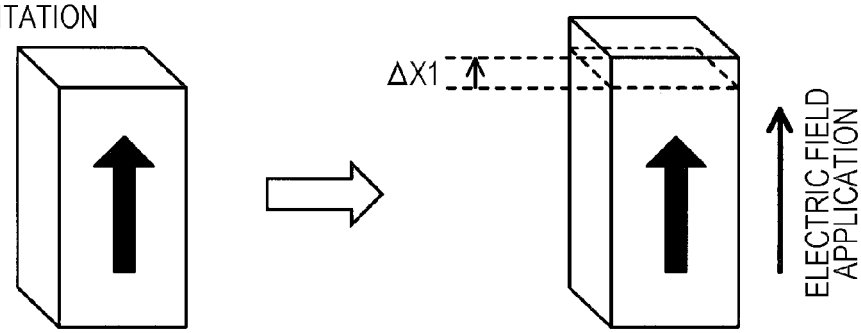
FIG. 9 is an explanatory view schematically illustrating a difference in piezoelectric strain between piezoelectric materials having different crystal orientations.
Figure 9:
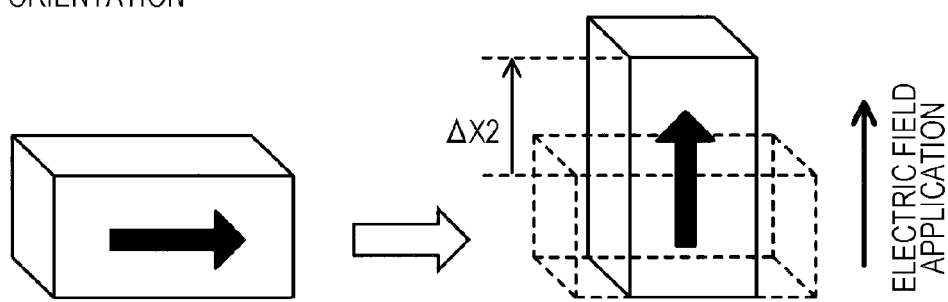

FIG. 7 is a graph illustrating a result of carrying out 2θ/θ measurement of x-ray diffraction on the PLZT film formed by sputtering on PLT in the (100) orientation. E+n of the intensity (relative value) of the vertical axis in FIG. 7 represents $\times 10^{10}$. FIG. 7 shows that, when a PLZT film is formed to be the piezoelectric thin film 6, the PLZT film is also in the form of perovskite crystals mainly oriented in the (100) direction. Furthermore, since an intensity peak of PLZT appears within a range (21.5° to 22°) of 2θ corresponding to a crystal lattice spacing of 0.404 to 0.414 nm without being divided, PLZT is considered to undergo crystal growth while maintaining the Zr/Ti ratio that is the MPB composition ratio from the initial stage of film formation.

Although the intensity peak appears at the position of 21.8° shifted leftward on the horizontal axis from the position of 22° that is the value of 2θ corresponding to a crystal lattice spacing of 0.404 nm in the example illustrated in FIG. 7, an intensity peak may appear at the position of 22° that is the value of 2θ corresponding to a crystal lattice spacing of 0.404 nm without being divided depending on conditions for film formation, which is within the scope of the present invention. Alternatively, an intensity peak may appear at the position of 21.5° that is the value of 2θ corresponding to a crystal lattice spacing of 0.414 nm without being divided, which is within the scope of the present invention.

PLZT that is a Pb-based ferroelectric thin film has a narrower window (a proper range of film formation conditions for forming a desired film) for formation of a perovskite than PZT to which La is not added. APLZT perovskite film can, however, be formed stably on PLT and also in the (100) orientation by properly controlling the average grain size of Pt forming the lower electrode 4 and forming PLT having a high perovskite crystallinity in the (100) orientation.

[4. Supplementation]

Although the description was made above with the examples of PZT and PLZT to be the piezoelectric thin film 6, the ferroelectric thin film forming the piezoelectric thin film 6 may be any film having the perovskite crystal structure and is not limited to PZT and PLZT described above.

For example, when crystals of the perovskite ferroelectric thin film is expressed by a general formula $ABO_3$, the ferroelectric thin film may contain lead ions and further contain ions of at least one of barium (Ba), lanthanum (La), strontium (Sr), bismuth (Bi), lithium (Li), sodium (Na), calcium (Ca), cadmium (Cd), magnesium (Mg), and potassium (K) in the A site, and contain zirconium ions and titanium ions and further contain ions of at least one of vanadium (V), niobium (Nb), tantalum (Ta), chromium (Cr), molybdenum (Mo), tungsten (W), manganese (Mn), scandium (Sc), cobalt (Co), copper (Cu), indium (In), tin (Sn), gallium (Ga), cadmium (Cd), iron (Fe), and nickel (Ni) in the B site.

As described above, since a PLT film having a high perovskite crystallinity can be formed stably in a desired orientation by properly controlling the average grain size of Pt to be the lower electrode 4, the lead-based ferroelectric thin film can be stably formed in a desired orientation on the PLT film. Furthermore, as a result of containing an additive in PZT, the piezoelectric properties can further be improved.

Alternatively, the ferroelectric thin film may be made of a lead-free perovskite material containing no lead. For example, since lead-free metal oxides such as barium strontium titanate (BST) and strontiumbismuthtantalumoxide (SBT) having a perovskite structure exhibit good piezoelectric properties, the structure of the present embodiment in which the average grain size of Pt is controlled within a desired range can also be applied to a case where such a lead-free ferroelectric thin film is used to improve the piezoelectric properties.

The piezoelectric element as described above is a piezoelectric element including a lower electrode made of platinum, a buffer layer made of lead lanthanum titanate, and a perovskite ferroelectric thin film formed in this order on a substrate, in which platinum forming the lower electrode has an average grain size of not smaller than 50 nm and not larger than 150 nm.

If the average grain size of platinum (Pt) forming the lower electrode is smaller than the lower limit, the crystallinity of Pt is too low and it is thus difficult to stably form a buffer layer made of lead lanthanum titanate (PLT) having a high perovskite crystallinity thereon and to stably form a perovskite ferroelectric thin film on the buffer layer. Conversely, if the average grain size of Pt is larger than the upper limit, the crystallinity of Pt is too low and it is thus difficult to form a buffer layer in a desired orientation (the (100) orientation, for example) different from the self-orientation ((111) direction) of Pt on the lower electrode and to form a ferroelectric thin film in a desired orientation (the (100) orientation, for example) that is high in the piezoelectric properties on the buffer layer.

When the average grain size of Pt is in the aforementioned range, it is therefore possible to stably form a PLT film having a high perovskite crystallinity to be the buffer layer in a desired orientation on the lower electrode made of Pt and to stably form the perovskite ferroelectric thin film in a desired orientation on the buffer layer. As a result, high piezoelectric properties can be realized.

In the piezoelectric element, the average grain size of platinum is preferably not smaller than 100 nm and not larger than 150 nm. In this case, decrease in the Pt crystallinity can be reliably avoided, which can ensure formation of the buffer layer and the ferroelectric thin film in the perovskite crystal structure.

In the piezoelectric element, the buffer layer is preferably oriented in the (100) direction. In this case, the ferroelectric thin film can be easily formed in the (100) orientation on the buffer layer. Furthermore, since the ferroelectric thin film is oriented in the (100) direction, the piezoelectric properties can be improved by using domain rotation.

In the piezoelectric element, the ferroelectric thin film is made of lead zirconate titanate expressed by $Pb(Zr_xTi_{1-x})O_3$ where x=0.50 to 0.55, and an intensity peak of the ferroelectric thin film is preferably within a range of 2θ corresponding to a crystal lattice spacing of 0.404 to 0.414 nm obtained by 2θ/θ measurement of x-ray diffraction.

When x=0.50 to 0.55 is satisfied in lead zirconate titanate (PZT) expressed by $Pb(Zr_xTi_{1-x})O_3$, PZT has what is called a MPB composition. If an intensity peak of PZT appears within the range of 2θ corresponding to a crystal lattice spacing of 0.404 to 0.414 nm when 2θ/θ measurement of x-ray diffraction is carried out on such PZT, PZT is considered to undergo crystal growth while maintaining the MPB composition from the initial stage of film formation. PZT having the MPB composition can therefore further improve the piezoelectric properties.

In the piezoelectric element, an insulating film may be formed between the substrate and the lower electrode.

When the piezoelectric element is applied to a device such as an inkjet head, current leakage from the electrode to the substrate can be prevented by the insulating film, which can realize a reliable device.

In the piezoelectric element, the insulating film may be made of silicon oxide.

Although silicon oxide ($SiO_2$) is amorphous and has no orientation, a perovskite ferroelectric thin film can also be formed in a desired orientation by controlling the average grain size of Pt as described above even when the ferroelectric thin film is formed on such $SiO_2$ with a lower electrode and a buffer layer therebetween.

In the piezoelectric element, an adhesion layer is preferably formed between the substrate and the lower electrode. As a result of providing the adhesion layer, adhesion between the lower electrode and the substrate (or the insulating film) is improved, which can reduce separation of the lower electrode from the underlying layer. In particular, when the adhesion layer is made of titanium, the effect can be reliably produced.

In the piezoelectric element, when crystals of the perovskite ferroelectric thin film are expressed by a general formula $ABO_2$, the ferroelectric thin film may contain lead ions and further contain ions of at least one of barium, lanthanum, strontium, bismuth, lithium, sodium, calcium, cadmium, magnesium, and potassium in the A site, and contain zirconium ions and titanium ions and further contain ions of at least one of vanadium, niobium, tantalum, chromium, molybdenum, tungsten, manganese, scandium, cobalt, copper, indium, tin, gallium, cadmium, iron, and nickel in the B site.

Even when the ferroelectric thin film is made of PZT containing an additive added thereto in this manner, a perovskite ferroelectric thin film can be stably formed in a desired orientation on PLT to be a buffer layer. Furthermore, as a result of containing an additive in PZT, the piezoelectric properties of the ferroelectric thin film can further be improved.

According to the structure described above, a PLT film having a high perovskite crystallinity to be a buffer layer can be stably formed in a desired orientation on a lower electrode, and a perovskite ferroelectric thin film can be stably formed in a desired orientation on the buffer layer, which can realize high piezoelectric properties.

INDUSTRIAL APPLICABILITY

The piezoelectric element according to the present invention can be used for MEMS actuators (actuators for inkjet printers and projectors), and MEMS sensors (pyroelectric sensors, ultrasonic sensors), for example.

REFERENCE SIGNS LIST 1 substrate
2 thermal oxide film (insulating film)
3 adhesion layer
4 lower electrode
5 buffer layer
6 piezoelectric thin film (ferroelectric thin film)
10 piezoelectric element

The invention claimed is:

1. A piezoelectric element comprising:
a substrate;
a lower electrode made of platinum that is positioned above the substrate;
a buffer layer made of lead lanthanum titanate, wherein the buffer layer is oriented in a (100) direction; and
a perovskite ferroelectric thin film, wherein the perovskite ferroelectric thin film is located further from the substrate than the lower electrode and the buffer layer is positioned between the lower electrode and the perovskite ferroelectric thin film,
wherein the platinum forming the lower electrode has an average grain size of not smaller than 50 nm and not larger than 150 nm, and
wherein the ferroelectric thin film is oriented in the (100) direction.

2. The piezoelectric element according to claim 1, wherein the average grain size of platinum is not smaller than 100 nm and not larger than 150 nm.

3. The piezoelectric element according to claim 1, wherein the ferroelectric thin film comprises lead zirconate titanate expressed by $Pb(Zr_xTi_{1-x})O_3$ where x=0.50 to 0.55, and the ferroelectric thin film has an intensity peak within a range of 2θ corresponding to a crystal lattice spacing of 0.404 to 0.414 nm obtained by 2θ/θ measurement of x-ray diffraction.

4. The piezoelectric element according to claim 1, wherein an insulating film is formed between the substrate and the lower electrode.

5. The piezoelectric element according to claim 4, wherein the insulating film comprises silicon oxide.

6. The piezoelectric element according to claim 1, wherein an adhesion layer is formed between the substrate and the lower electrode.

7. The piezoelectric element according to claim 6, wherein the adhesion layer comprises titanium.

8. The piezoelectric element according to claim 1, wherein when crystals of the perovskite ferroelectric thin film are expressed by a general formula $ABO_3$, the ferroelectric thin film comprises lead ions and further comprises ions of at least one of barium, lanthanum, strontium, bismuth, lithium, sodium, calcium, cadmium, magnesium, and potassium in the A site, and the ferroelectric thin film comprises zirconium ions and titanium ions and further comprises ions of at least one of vanadium, niobium, tantalum, chromium, molybdenum, tungsten, manganese, scandium, cobalt, copper, indium, tin, gallium, cadmium, iron, and nickel in the B site.

9. The piezoelectric element according to claim 2, wherein the ferroelectric thin film is made of lead zirconate titanate expressed by $Pb(Zr_xTi_{1-x})O_3$ where x=0.50 to 0.55, and the ferroelectric thin film has an intensity peak within a range of 2θ corresponding to a crystal lattice spacing of 0.404 to 0.414 nm obtained by 2θ/θ measurement of x-ray diffraction.

10. The piezoelectric element according to claim 2, wherein an insulating film is formed between the substrate and the lower electrode.

11. The piezoelectric element according to claim 2, wherein an adhesion layer is formed between the substrate and the lower electrode.

12. The piezoelectric element according to claim 2, wherein when crystals of the perovskite ferroelectric thin film are expressed by a general formula $ABO_3$, the ferroelectric thin film comprises lead ions and further comprises ions of at least one of barium, lanthanum, strontium, bismuth, lithium, sodium, calcium, cadmium, magnesium, and potassium in the A site, and the ferroelectric thin film comprises zirconium ions and titanium ions and further comprises ions of at least one of vanadium, niobium, tantalum, chromium, molybdenum, tungsten, manganese, scandium, cobalt, copper, indium, tin, gallium, cadmium, iron, and nickel in the B site.

13. The piezoelectric element according to claim 1, wherein the lead lanthanum titanate of the buffer layer has a structure so that the perovskite ferroelectric thin film is formed stably in a (100) orientation.

* * * * *